(12) United States Patent
Sullivan et al.

(10) Patent No.: US 8,432,756 B1
(45) Date of Patent: Apr. 30, 2013

(54) COLLISION PREVENTION IN A DUAL PORT MEMORY

(75) Inventors: Steven C. Sullivan, Austin, TX (US); William V. Miller, Austin, TX (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/275,920

(22) Filed: Oct. 18, 2011

(51) Int. Cl.
*G11C 7/00* (2006.01)

(52) U.S. Cl.
USPC ............... 365/195; 365/230.05; 365/189.14

(58) Field of Classification Search ........... 365/195, 365/230.05, 189.14–189.16
See application file for complete search history.

(56) References Cited

U.S. PATENT DOCUMENTS

| 5,276,842 | A | | 1/1994 | Sugita | |
|---|---|---|---|---|---|
| 5,384,734 | A | * | 1/1995 | Tsujihashi et al. | ........ 365/189.04 |
| 5,781,480 | A | | 7/1998 | Nogle | |
| 6,556,501 | B1 | * | 4/2003 | Naffziger | ................ 365/230.05 |
| 7,630,272 | B2 | | 12/2009 | Kenkare | |
| 7,894,296 | B2 | * | 2/2011 | Lee et al. | ................ 365/230.05 |

* cited by examiner

*Primary Examiner* — David Lam
(74) *Attorney, Agent, or Firm* — Stephen J. Curran; Meyertons, Hood, Kivlin, Kowert & Goetzel, P.C.

(57) ABSTRACT

A dual port memory includes a mechanism for preventing collisions. The memory includes dual port bit cells arranged in rows and columns and each bit cell stores a data bit. The memory also includes a wordline unit that may provide a respective write wordline signal and a respective read wordline signal to each row of bit cells. The wordline unit may also selectively inhibit the read wordline signal for a given row based upon address information that is indicative of whether a write operation will be performed to the given row.

13 Claims, 4 Drawing Sheets

COLLISION PREVENTION IN A DUAL PORT MEMORY

BACKGROUND

1. Technical Field

This disclosure relates to memories, and more particularly to collision prevention in a memory.

2. Description of the Related Art

Many devices use memory arrays that include dual port bit cells in which the bit cells have separate read and write wordlines and separate read bitlines and write bitlines to allow for simultaneous read and write access to both the read and write ports, as long as the read is specified on a different address than the write. This is particularly true in memories used as register files. However, when the read and write address are the same, a collision would result if both the read and write are allowed to proceed. These collisions can be problematic for a variety of reasons. For example, the time it takes a bit cell to recover from a write operation may increase significantly due to the write operation trying to overwrite opposite data being read out. In addition, collisions may cause additional current drain, as well as erroneous data being read from or written to the affected bit cell.

Accordingly, there are conventional mechanisms to prevent these collisions. One such mechanism uses comparators to detect the same address up front. This type of address detection may require many exclusive-OR (XOR) gates and a "tree" of NAND/NOR gates to combine the many address bits into a single "collision" signal to stop a given wordline from being activated and causing slow write behavior. This conventional approach can be slow, and requires many more gates. In addition, some bit cells may be designed to withstand the contention that arises from a collision. More particularly, another conventional approach increases the size of the n-type pulldown transistors to be greater than the sum of the wordline pass transistors. This is not considered to be an optimal approach.

SUMMARY OF THE EMBODIMENTS

Various embodiments of a mechanism for preventing collisions in a dual port memory are disclosed. Broadly speaking, a mechanism for preventing collisions in a dual port memory is contemplated in which the read wordline signal for a given row may be selectively inhibiting based upon address information that is indicative of whether a write operation will be performed to the given row. More particularly, a dual port memory includes read and write wordlines for each row of bit cells in the memory array to accommodate simultaneous reads and writes to different rows. Rather than performing an address comparison between a read and write and then waiting on the result, the read wordline signal for a given row may be inhibited in response to decoding a write address to the given row. The read wordline signal may be inhibited irrespective of whether a read operation will actually be performed.

In one embodiment, a memory includes dual port bit cells arranged in rows and columns and each bit cell stores a data bit. The memory also includes a wordline unit that may provide a respective write wordline signal and a respective read wordline signal to each row of bit cells. The wordline unit may also selectively inhibit the read wordline signal for a given row based upon address information that is indicative of whether a write operation will be performed to the given row.

In one specific implementation, the wordline unit may inhibit the read wordline signal for a given row in response to the address information indicating that a write operation will be performed to the given row irrespective of whether a read operation will actually be performed.

Figure 1:
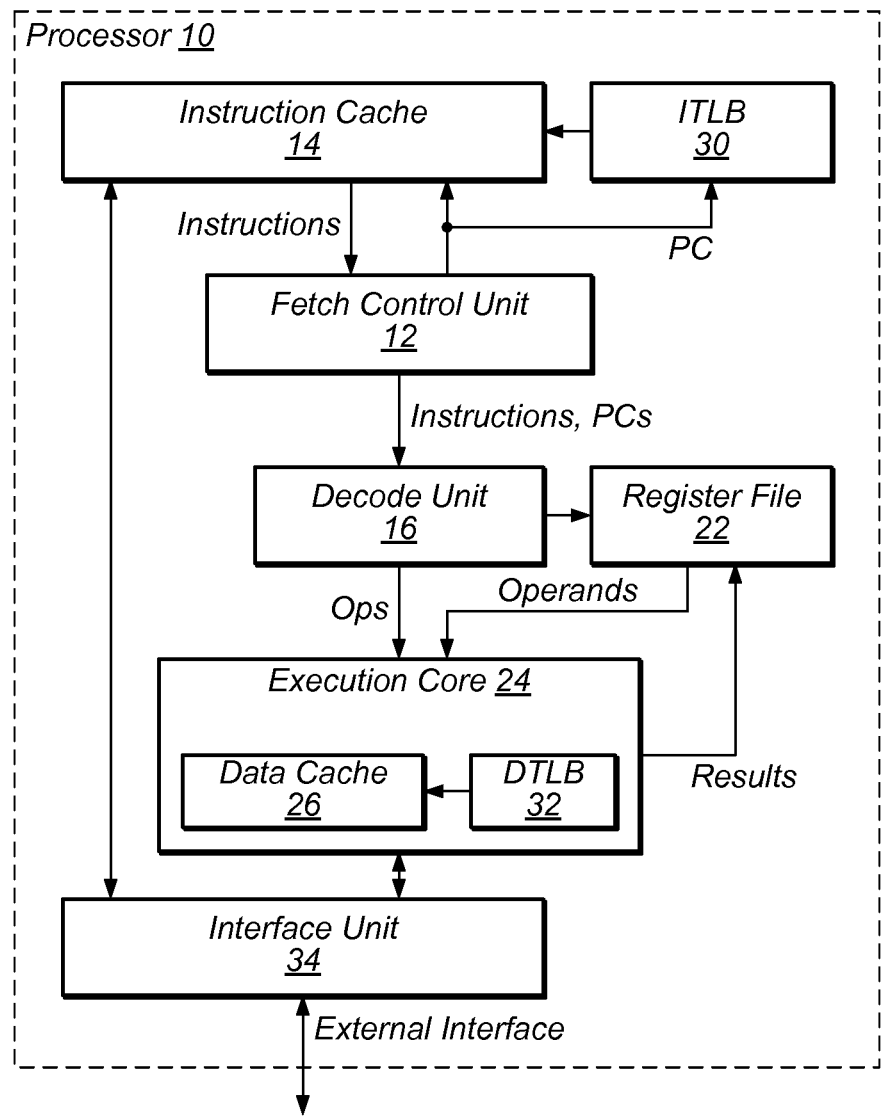
FIG. 1 is a block diagram of one embodiment of a processor.

Specific embodiments are shown by way of example in the drawings and will herein be described in detail. It should be understood, however, that the drawings and detailed description are not intended to limit the claims to the particular embodiments disclosed, even where only a single embodiment is described with respect to a particular feature. On the contrary, the intention is to cover all modifications, equivalents and alternatives that would be apparent to a person skilled in the art having the benefit of this disclosure. Examples of features provided in the disclosure are intended to be illustrative rather than restrictive unless stated otherwise.

As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six, interpretation for that unit/circuit/component.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

DETAILED DESCRIPTION

Turning now to FIG. 1, a block diagram of one embodiment of a processor is shown. The processor 10 includes an instruction cache (ICache) 14 that is coupled to a fetch control unit 12. The processor also includes a decode unit 16 that is coupled to the fetch control unit 12 and to a register file 22, which is in turn coupled to an execution core 24. The execution core 24 is coupled to an interface unit 34, which may be coupled to an external interface of the processor 10, as desired.

In one embodiment, the fetch control unit 12 is configured to provide a program counter address (PC) for fetching from the instruction cache 14. The instruction cache 14 is configured to provide instructions (with PCs) back to the fetch control unit 12 to be fed into the decode unit 16. The decode unit 16 may generally be configured to decode the instructions into instruction operations (ops) and to provide the decoded ops to the execution core 24. The decode unit 16 may also provide decoded operands to the register file 22, which may provide operands to the execution core 24. The decode unit 16 may also be configured to schedule each instruction and provide the correct register values for execution core 24 to use.

The register file 22 may also receive results from execution core 24 that are to be written into the register file 22. Accordingly, the register file 22 may generally include any set of registers usable to store operands and results. Thus, the register file 22 may be implemented using a variety of storage types such as flip-flop type storages, random access memory (RAM), and the like. In one embodiment, the register file 22 may be implemented using a dual port static RAM (SRAM). As mentioned above, in such embodiments it may be important to prevent simultaneous writes and reads to the same bit cells of a dual port memory. As described in greater detail below in conjunction with the description of FIG. 2 and FIG. 3, a collision avoidance mechanism may prevent these occurrences by inhibiting a read wordline signal from accessing a row of bit cells during a write operation to that row.

The instruction cache 14 may include control logic and memory arrays. The memory arrays may be used to store the cached instructions to be executed by processor 10 and the associated cache tags. Instruction cache 14 may have any capacity and construction (e.g. direct mapped, set associative, fully associative, etc.). Instruction cache 14 may include any cache line size.

It is contemplated that the processor 10 may implement any suitable instruction set architecture (ISA), such as ARM™, PowerPC™, or x86 ISAs, combinations thereof, etc. In some embodiments, the processor 10 may implement an address translation scheme in which one or more virtual address spaces are made visible to executing software. Memory accesses within the virtual address space are translated to a physical address space corresponding to the actual physical memory available to the system, for example using a set of page tables, segments, or other virtual memory translation schemes. In embodiments that employ address translation, processor 10 may store a set of recent and/or frequently used virtual-to-physical address translations in a translation lookaside buffer (TLB), such as instruction TLB (ITLB) 30.

The execution core 24 may perform the various operations (e.g., MOV, ADD, SHIFT, LOAD, STORE, etc.) indicated by each instruction. In the illustrated embodiment, the execution core 24 includes data cache 26, which may be a cache memory for storing data to be processed by the processor 10. Like instruction cache 14, data cache 26 may have any suitable capacity, construction, or line size (e.g. direct mapped, set associative, fully associative, etc.). Moreover, data cache 26 may differ from the instruction cache 14 in any of these details. As with instruction cache 14, in some embodiments, data cache 26 may be partially or entirely addressed using physical address bits. Correspondingly, data TLB (DTLB) 32 may be provided to cache virtual-to-physical address translations for use in accessing data cache 26 in a manner similar to that described above with respect to ITLB 30. It is noted that although ITLB 30 and DTLB 32 may perform similar functions, in various embodiments they may be implemented differently. For example, they may store different numbers of translations and/or different translation information.

Interface unit 34 may generally include the circuitry for interfacing processor 10 to other devices on the external interface. The external interface may include any type of interconnect (e.g. bus, packet, etc.). The external interface may be an on-chip interconnect, if processor 10 is integrated with one or more other components (e.g. a system on a chip configuration). The external interface may be on off-chip interconnect to external circuitry, if processor 10 is not integrated with other components. In various embodiments, processor 10 may implement any instruction set architecture.

Figure 2:
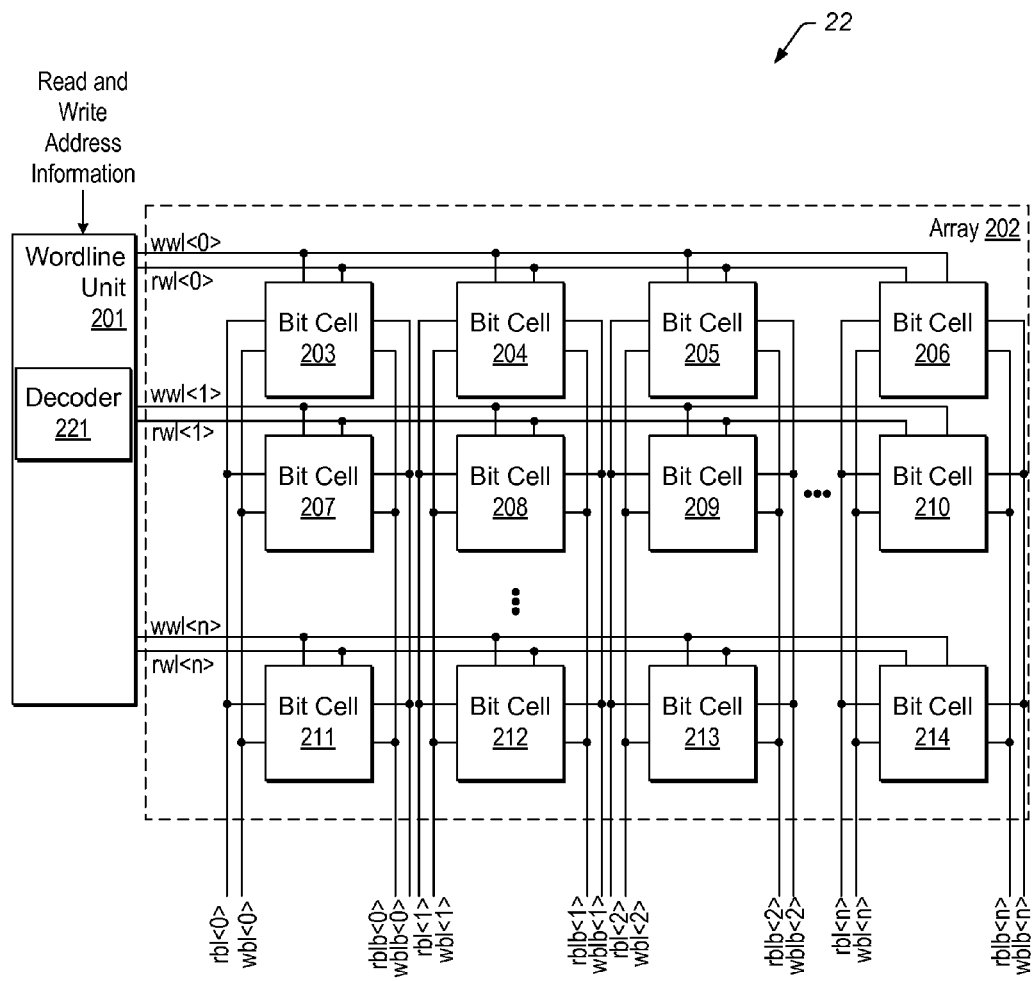
FIG. 2 is a block diagram of one embodiment of a memory including a collision avoidance mechanism.

Referring to FIG. 2, a block diagram of one embodiment of a register file memory is shown. The register file memory 22 includes a wordline unit 201 that is coupled to an array 203 that includes a number of bit cells (e.g., 203-214). As shown, the bit cells are arranged into rows and columns and are coupled to the wordline unit 201 by read wordlines (e.g., rwl<0>-rwl<n>) and write wordlines (e.g., wwl<0>-wwl<n>), where each row of the array (e.g., bit cells 203-206) is coupled to a respective read and write wordline pair (e.g., rwl<0> and wwl<0>). In addition, each of the bit cell columns (e.g., bit cells 203-211) is coupled to a differential read and write bitline pair (e.g., rbl<0>, wbl<0>; rblb<0>, wblb<0>).

As shown, the bit cells, and thus the array 203, are configured as dual port bit cells since each bit cell is coupled to separate read and write wordines, and separate read and write bitlines. Accordingly, the array 203 can accommodate a simultaneous read and write to different rows.

In one embodiment, the wordline unit 201 is configured to receive read and write address information, and to generate the appropriate wordline signals to access the bit cells. More particularly, when a read and/or a write address is received, the address is decoded using, for example, a decoder 221 that may perform a number of partial decode operations to create a number of partial decode select signals (shown in FIG. 3). These partial decode select signals may be used to generate the appropriate wordlines to access the row of bit cells that correspond to the received address.

As mentioned above, read and write collisions may occur in dual port memories unless precautions are taken to avoid or prevent them. As described in greater detail below in conjunction with the description of FIG. 3, the wordline unit 201 is configured to avoid or prevent a collision between a read and a write to the same row by inhibiting the read wordline signal to a given row during a write to that row.

It is noted that in the embodiment shown in FIG. 2, the memory corresponds to the register file 22 of FIG. 1. However, it is contemplated that in other embodiments, the memory may be any type of memory that is implemented in a dual port configuration.

Figure 3:
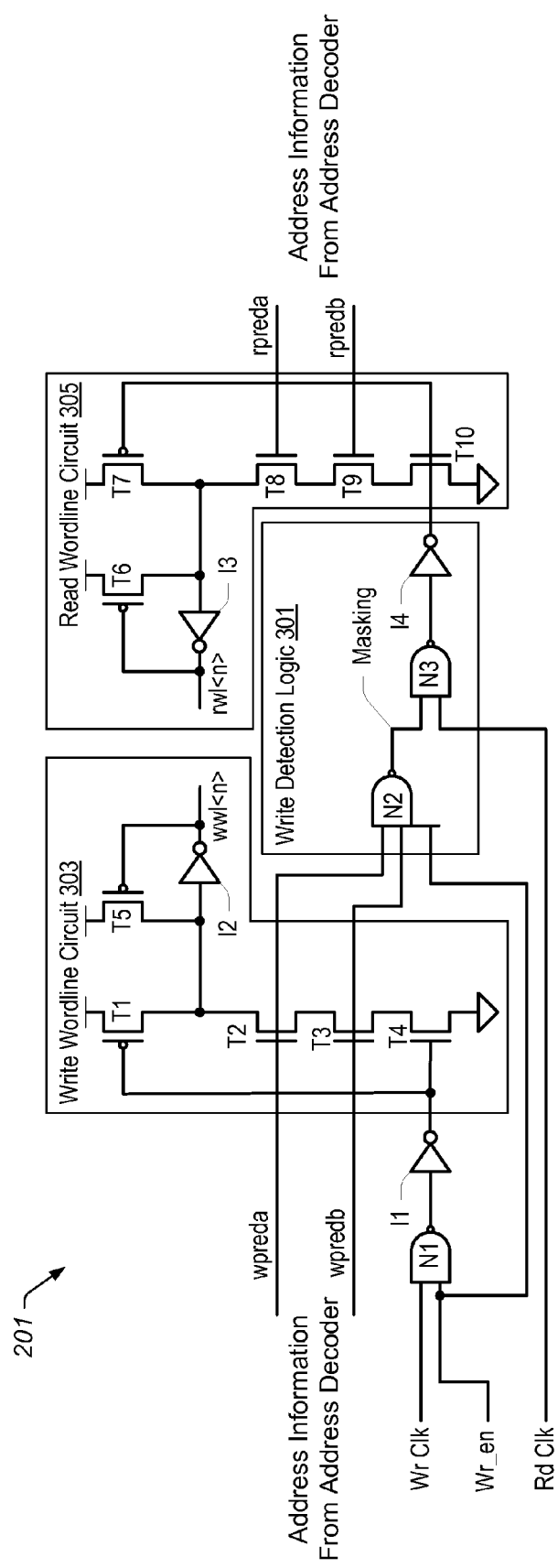
FIG. 3 is a block diagram of one embodiment of the collision avoidance mechanism of FIG. 2.

Turning to FIG. 3, a block diagram of one embodiment of the wordline unit including a collision avoidance mechanism of FIG. 2 is shown. The wordline unit 201 includes a write wordline circuit 303 that includes transistors T1 through T5, and an inverter I2, which are connected together to form a dynamic logic gate, which is also referred to as a clocked precharge gate. In addition, the wordline unit 201 includes a write wordline enable circuit that includes the NAND gate N1 that is coupled to the input of the inverter I1. Similarly, the wordline unit 201 includes a read wordline circuit 305 that includes transistors T6 through T10, and an inverter I3, which are also connected together to form a dynamic logic gate. Further, the wordline unit 201 includes write detection logic 301 that includes a read wordline enable circuit that includes a NAND gate N3 that is coupled to the input of the inverter I4, as well as a NAND gate N2, which is coupled to one input of the NAND gate N3. It is noted that the embodiment of the wordline unit 201 shown in FIG. 3 represents a portion of the wordline unit 201. More particularly, the circuit shown in FIG. 3 corresponds to one wordline circuit pair as denoted by the wwl<n> and rwl<n>, where n may be any whole number. It is further noted that there may be at least one such circuit for each row of bit cells of the register file 22.

As described above in conjunction with the description of FIG. 2, the read and write address information received by the wordline unit 201 is decoded by the decoder 221 into partial decode select signals. Accordingly, in one embodiment, the partial decode select signals correspond to the wpreda, wpredb, rpreda, and rpredb signals shown in FIG. 3. More particularly, the decoder 221 may generate a pair of partial decode select signals for each wordline circuit for each row. The wordline circuits use these partial decode select signals to assert the respective wordline signals of the respective array rows.

Accordingly, each of the write wordline circuit 303 and the read wordline circuit 305 are configured to generate a respective wordline signal to the row to which they are connected. More particularly, in the write wordline circuit the transistors T1 and T5, and the inverter I2 form a precharge and hold circuit, while the transistors T2, T3, and T4 correspond to an n-tree logic circuit and an evaluate circuit, respectively. When there is an asserted enable signal at the top input of the NAND gate N1, the Wr CLK signal is passed from the bottom input of the NAND gate N1 through the inverter I1, to the gates of transistors T1 and T4. When the Wr CLK is at a logic value of zero, the transistor T4 is cut off, and the transistor T1 conducts charging the input to the inverter I2, which drives the wwl<n> wordline low to a logic value of zero. In this state, since there is no path from circuit ground to the inverter I2, the output wordline wwl<n> stays low and the corresponding row of bit cells is not being written. The transistor T5 is a weak pull-up holding transistor, which will maintain the logic value of one to the inverter I2 input as long as it is not discarded to a value of zero via the stronger T2-T4 transistor tree. When the Wr CLK transitions to a logic value of one while the Wr_en signal is also a logic value of one, the transistor T1 is turned off, and the transistor T4 conducts. If either of the signals wpreda and wpredb are at a logic value of zero, there is no path from circuit ground to the inverter I2, and the output wordline wwl<n> stays low. If however, the wpreda, wpredb, and Wr_en are all at a logic value of one when the Wr CLK transitions to a logic value of one, then a path from circuit ground to the inverter I2 now exists and the input to the inverter I2 drains to circuit ground causing the output wordline wwl<n> to transition to a logic value of one, which causes the data on the write bitlines to be written to the cells of the corresponding row.

The read wordline circuit 305 operates similar to the write wordline circuit 303 in that the read wordline circuit 305 is precharged, and the rwl<n> stays low and the corresponding row of bit cells is not being read whenever the output of the inverter I4 is low. However, for the read wordline rwl<n> to be asserted, both of the rpreda and rpredb signals must be at a logic value of one, and the wpreda, wpredb, and the Wr_en signals cannot all be at logic value of one. More particularly, similar to the enable logic of the write wordline circuit 303, the enable logic of the read wordline circuit 305 also includes a NAND gate (e.g., N3) coupled to an inverter (e.g., I4), with the Rd CLK input on the bottom of the NAND gate N3. However, to allow the Rd CLK to pass through to the transistors T10 and T7, the masking signal must be at a logic value of one. By inspection, it can be seen that the NAND gate N2 of the write detection logic 301 causes the masking signal to be at a logic value of zero whenever the wpreda, wpredb, and Wr_en signals are all at a logic value of one. Accordingly, in one embodiment whenever a given row is being written, all of the wpreda, wpredb, and Wr_en signals will be at a logic value of one, which effectively inhibits or disables the read wordline circuit 305 from asserting the rwl<n> signal (even if the rpreda and rpredb signals are at a logic value of one). By disabling the read wordline circuit 305, the row cannot be simultaneously read and written, thereby avoiding a collision.

In various embodiments, since the read is not actually performed the processor 10 may simply discard any read data on the read bitlines, or simply retry the read later. In one embodiment, the processor 10 may include system logic that can detect a collision by comparing the actual read and wrote addresses. However, in such an embodiment, since the comparison is slow, the write may be performed and a read to the same address is inhibited at the wordline unit 201 as described above. If the comparison later indicates that there was no collision, there was no time wasted since the write has already completed. Similarly, if the comparison indicates that there was a collision, since the write has already completed, the read operation may be retried and the data read will be the data that was just written. Accordingly, this collision avoidance mechanism may add only a small number of transistors with a minimal impact on speed.

Figure 4:
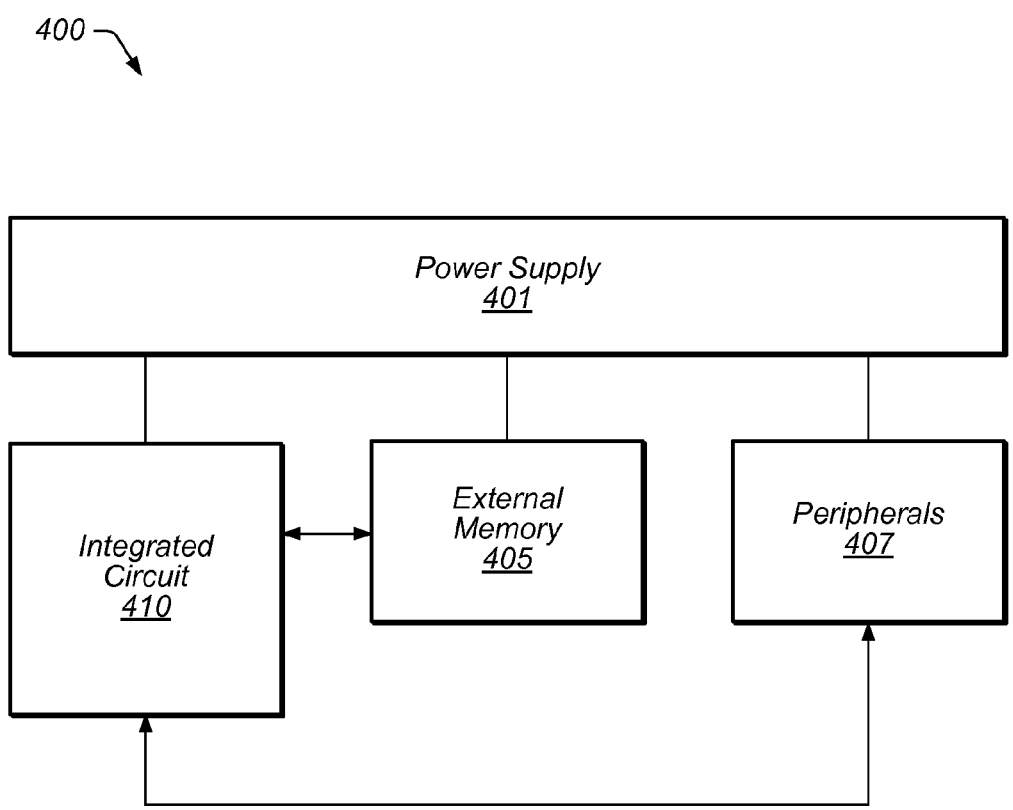
FIG. 4 is a block diagram of one embodiment of a system.

Referring to FIG. 4, a block diagram of one embodiment of a system is shown. The system 400 includes at least one instance of an integrated circuit 410 coupled to one or more peripherals 407 and an external system memory 405. The system 400 also includes a power supply 401 that may provide one or more supply voltages to the integrated circuit 410 as well as one or more supply voltages to the memory 405 and/or the peripherals 407.

In one embodiment, the integrated circuit 410 be a system on a chip including one or more instances of a processor and various other circuitry such as a memory controller, video and/or audio processing circuitry, on-chip peripherals and/or peripheral interfaces to couple to off-chip peripherals, etc. More particularly, the integrated circuit 410 may include one or more instances of a processor such as processor 10 from FIG. 1. As such, the integrated circuit 410 may include one or more instances of a register file memory such as register file memory 22 of FIG. 1. Accordingly, embodiments that include the register file memory 22, include the collision avoidance mechanism described above.

The peripherals 407 may include any desired circuitry, depending on the type of system. For example, in one embodiment, the system 400 may be included in a mobile device (e.g., personal digital assistant (PDA), smart phone, etc.) and the peripherals 407 may include devices for various types of wireless communication, such as WiFi, Bluetooth, cellular, global positioning system, etc. The peripherals 407 may also include additional storage, including various types of RAM storage, solid-state storage, or disk storage. As such, the peripherals 407 may also include SRAM that includes the redundancy repair mechanism described above. The peripherals 407 may include user interface devices such as a display screen, including touch display screens or multitouch display screens, keyboard or other input devices, microphones, speakers, etc. In other embodiments, the system 400 may be included in any type of computing system (e.g. desktop personal computer, laptop, workstation, net top etc.).

The external system memory 405 may include any type of memory. For example, the external memory 405 may be in the DRAM family such as synchronous DRAM (SDRAM), double data rate (DDR, DDR2, DDR3, etc.), or any low power version thereof. However, external memory 605 may also be implemented in SDRAM, static RAM (SRAM), or other types of RAM, etc.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A memory comprising:
   a plurality of dual port bit cells arranged in rows and columns, wherein each bit cell is configured to store a data bit; and
   a wordline unit configured to provide a respective write wordline signal and a respective read wordline signal to each row of bit cells, wherein the wordline unit is further configured to selectively inhibit the read wordline signal for a given row in response to address information indicating that a write operation will be performed to the given row;
   wherein the address information corresponds to one or more bits of a partially decoded a write address.

2. The memory as recited in claim 1, wherein the wordline unit includes detection logic configured to selectively generate a read wordline mask signal to inhibit the read wordline signal dependent upon whether the one or more bits of the partially decoded write address correspond to the given row.

3. The memory as recited in claim 2, wherein the detection logic is configured to perform a logic operation between a first partially decoded write address bit and a second partially decoded write address bit to selectively generate the read wordline mask signal.

4. The memory as recited in claim 3, wherein the logic operation comprises a NAND operation.

5. A register file memory comprising:
   a memory array including a plurality of dual port bit cells arranged in rows and columns, wherein each bit cell is configured to store a data bit; and
   a wordline unit coupled to the memory array and configured to provide a respective write wordline signal and a respective read wordline signal to each row of bit cells, wherein the wordline unit is further configured to selectively inhibit the read wordline signal for a given row in response to determining that a write operation will be performed to the given row;
   wherein the wordline unit includes detection logic configured to selectively generate a read wordline mask signal to inhibit the read wordline signal dependent upon whether the one or more bits of a partially decoded write address correspond to the given row.

6. The register file memory as recited in claim 5, wherein the wordline unit includes a write wordline circuit and a read wordline circuit, each implemented as a respective dynamic logic gate, wherein the mask signal is configured to gate a read clock, thereby preventing the read wordline circuit from evaluating read address information provided to the read wordline circuit.

7. The register file memory as recited in claim 5, wherein the wordline unit is configured to selectively inhibit the read wordline signal for a given row in response to determining that a write operation will be performed to the given row irrespective of whether or not a read operation has been requested to the given row.

8. A system comprising:
   a memory; and
   one or more processors coupled to the memory, wherein at least one of the one or more processors includes a register file memory;
   wherein the register file memory includes:
      a plurality of dual port bit cells arranged in rows and columns, wherein each bit cell is configured to store a data bit; and
      a wordline unit configured to provide a respective write wordline signal and a respective read wordline signal to each row of bit cells, wherein the wordline unit is further configured to selectively inhibit the read wordline signal for a given row based upon one or more bits of a partially decoded write address that indicate whether a write operation will be performed to the given row;
      wherein the wordline unit includes detection logic configured to selectively generate a read wordline mask signal to inhibit the read wordline signal dependent upon whether the one or more bits of the partially decoded write address correspond to the given row.

9. The system as recited in claim 8, wherein the wordline unit is configured to inhibit the read wordline signal for a given row in response to the one or more bits of the partially decoded write address indicating that a write operation will be performed to the given row.

10. The system as recited in claim 8, wherein the wordline unit is configured to generate the read wordline mask signal to inhibit the read wordline signal for the given row in response to determining that a write operation will be performed to the given row irrespective of whether or not a read operation has been requested to the given row.

11. A method comprising:
    receiving a respective write wordline signal and a respective read wordline signal at each row of bit cells of a plurality of bit cells arranged into rows and columns of a memory array; and
    a wordline unit selectively inhibiting the respective read wordline signal for a given row based upon address information that is indicative of whether a write operation will be performed to the given row;
    wherein the selectively inhibiting includes detecting a write operation to the given row and inhibiting the read wordline signal to the given row;
    wherein detecting the write operation to the given row includes performing a logic operation between a first partially decoded write address bit and a second partially decoded write address bit to selectively generate a read wordline mask signal for selectively inhibiting the read wordline signal.

12. A mobile communication device comprising:
    a memory,
    a processor coupled to the memory, wherein the processor includes a register file memory including:
       a plurality of dual port bit cells arranged in rows and columns, wherein each bit cell is configured to store a data bit;
       a wordline unit configured to provide a respective write wordline signal and a respective read wordline signal to each row of bit cells, wherein the wordline unit is further configured to selectively inhibit the read wordline signal for a given row based upon address information that is indicative of whether a write operation will be performed to the given row;
       wherein the wordline unit includes detection logic configured to selectively generate a read wordline mask signal to inhibit the read wordline signal dependent upon whether one or more bits of a partially decoded write address correspond to the given row.

13. The mobile communication device as recited in claim 12, wherein the wordline unit is configured to selectively inhibit the read wordline signal for a given row in response to determining that a write operation will be performed to the given row irrespective of whether or not a read operation has been requested to the given row.

\* \* \* \* \*